(12) United States Patent
Maxik et al.

(10) Patent No.: US 8,476,829 B2
(45) Date of Patent: Jul. 2, 2013

(54) LED LIGHTING SYSTEM

(75) Inventors: Fredric S. Maxik, Indialantic, FL (US); David E. Bartine, Cape Canaveral, FL (US); Robert R. Soler, Cocoa Beach, FL (US); Valerie Ann Bastien, Melbourne, FL (US); James Lynn Schellack, Cocoa Beach, FL (US); Eliza Katar Grove, Satellite Beach, FL (US)

(73) Assignee: Biological Illumination, LLC, Satellite Beach, FL (US)

( * ) Notice: Subject to any disclaimer, the term of this patent is extended or adjusted under 35 U.S.C. 154(b) by 0 days.

(21) Appl. No.: 13/608,935

(22) Filed: Sep. 10, 2012

(65) Prior Publication Data
US 2013/0005058 A1 Jan. 3, 2013

Related U.S. Application Data

(62) Division of application No. 13/012,637, filed on Jan. 24, 2011, now Pat. No. 8,324,815.

(51) Int. Cl.
*H01J 7/44* (2006.01)

(52) U.S. Cl.
USPC ............................................................ 315/35

(58) Field of Classification Search
USPC ........... 315/32, 35, 50, 112, 114, 115, 185 R, 315/294, 291; 362/84, 294, 311.02, 311.03, 362/311.11, 311.15
See application file for complete search history.

(56) References Cited

U.S. PATENT DOCUMENTS

| | | | | |
|---|---|---|---|---|
| 4,433,233 A * | 2/1984 | Hierholzer et al. | ........... | 219/553 |
| 6,149,283 A | 11/2000 | Conway et al. | | |
| 6,441,943 B1 * | 8/2002 | Roberts et al. | ................ | 359/267 |
| 7,352,138 B2 * | 4/2008 | Lys et al. | ....................... | 315/291 |
| 7,661,852 B2 * | 2/2010 | Yu | ................... | 362/362 |
| 7,845,823 B2 * | 12/2010 | Mueller et al. | ................ | 362/231 |
| 8,053,972 B2 | 11/2011 | Bawendi et al. | | |
| 8,193,702 B2 * | 6/2012 | Lenk et al. | .................... | 313/506 |
| 8,282,250 B1 * | 10/2012 | Dassanayake et al. | ........ | 362/373 |
| 2005/0242734 A1 | 11/2005 | Maxik | | |
| 2007/0297061 A1 | 12/2007 | Kyomoto et al. | | |
| 2009/0160344 A1 | 6/2009 | Hsu et al. | | |
| 2009/0284155 A1 | 11/2009 | Reed et al. | | |
| 2010/0090577 A1 * | 4/2010 | Reed et al. | ....................... | 313/46 |
| 2010/0177496 A1 * | 7/2010 | Gillies et al. | .................... | 362/84 |
| 2010/0314985 A1 * | 12/2010 | Premysler | ....................... | 313/46 |

OTHER PUBLICATIONS

International Search Report for International Application No. PCT/US2012/021121, dated Aug. 27, 2012.

\* cited by examiner

*Primary Examiner* — Minh D A
(74) *Attorney, Agent, or Firm* — Mark R. Malek; Keith Olinga Mitchell; Zies Widerman & Malek

(57) ABSTRACT

LED lighting systems and methods of manufacture, which include one or more of the following: (1) a solid state active heat sink for cooling one or more LED chips; (2) a front end power supply providing high voltage to the active heat sink component; (3) a front end power supply that provides a relatively low voltage load to a plurality of LED chips; (4) a front end hybrid power supply with both a high and low voltage output, wherein the high voltage is at least 2kV higher than the low voltage output; (5) an over-mold encapsulating the front end components, wherein the over-mold is provided by a reaction injection molding process; (6) a digital microminor device (DMD) for providing pixilated light, color mixing, and intensity control; and (7) an optic having quantum dots (QDs), wherein the light output of the DMD activates for the QDs.

11 Claims, 3 Drawing Sheets

LED LIGHTING SYSTEM

CROSS-REFERENCE TO RELATED APPLICATIONS

This application is a divisional of U.S. patent application Ser. No. 13/012,637, filed on Jan. 24, 2011, which is incorporated herein by reference in its entirety.

FIELD OF THE INVENTION

The present invention relates to systems and methods for generating light. More specifically, the present invention relates to a light-emitting diode (LED) lighting system and methods of manufacture.

BACKGROUND

FIG. 1 illustrates a schematic diagram of an LED lighting system, such as an LED light bulb 100. Light bulb 100 includes a base 102, such as an Edison-type screw-in base, coupled to a housing 104. Within housing 104 is an open cavity 106 for receiving the electrical components of light bulb 100. Electrical leads 108 extend from base 102 and are electrically coupled to a substrate, such as a printed circuit board (PCB) 110. One or more electrical components 112 are mounted on PCB 110. Electrical components 112 may include circuitry for power conversion and drive mechanisms for light bulb 100. Such circuitry may include resistors, rectifying diodes, capacitors, and Zener diodes. For example, rectifying diodes are typically used for AC to DC power conversion. Capacitors, on the other hand, may be used as wave-rectifiers to reduce LED flicker.

Lamp 100 also generally includes one or more passive heat management components, such as an aluminum heat sink 114. As shown in FIG. 1, heat sink 114 completely surrounds housing 104. However, alternative systems include a heat sink disposed adjacent to housing 104, without necessarily surrounding the housing. In general, heat sink 114 supports and draws heat from one or more LED chips 116. One disadvantage of LED lighting systems with passive heat sinks is that heat management is limited by the thermal conductive properties of the heat sink material and form factor.

Lamp 100 may also include one or more photo down-conversion elements to convert monochromatic light emitted from LED chips 116 to polychromatic light. For example, phosphor coatings 118 may be applied to LED chips 116 to convert "blue" LED light to "white light." One disadvantage of such photo down-conversion techniques is that they are static designs that cannot be adjusted in "real-time." In other words, LED light bulbs using phosphor coatings can emit light only in the pre-designed color, and cannot be customized in real-time to alter the bulb's color output.

Light bulb 100 may further include an optic 120 to diffuse the light emitted from LED chips 116. Typical optics, however, are static components that offer little, or no, real-time modification or customization of the bulb's light output.

In practice, the assembly of light bulb 100 is a labor-intensive and costly process. First, the electrical components 112 are mounted and soldered onto PCB 110. Then, PCB 110 is inserted within cavity 106 of housing 104. Electrical leads 108 are coupled between base 102 and PCB 110. A potting compound is then inserted within cavity 106 to stabilize and set PCB 110 within housing 104. Heat sink 114 is then coupled to housing 104. LED chips 116 and optic 120 are then mounted on heat sink 114.

What is needed is an LED lighting system with fewer components, which is suitable for more automated and practical manufacturing methods. Additionally, what is needed is an LED lighting system that can be adjusted to suit varying lighting needs.

BRIEF SUMMARY

Provided herein are LED lighting systems and methods of manufacture that address the above-identified problems. In general, the embodiments provided herein include systems with one or more of the following: (1) a solid state active heat sink for cooling one or more LED chips; (2) a front end power supply providing high voltage to the active heat sink component; (3) a front end power supply that provides a relatively low voltage load to a plurality of LED chips; (4) a front end hybrid power supply with both a high and low voltage output, wherein the high voltage is at least 2 kV higher than the low voltage output; (5) an over-mold encapsulating the front end components, wherein the over-mold is provided by a reaction injection molding process; (6) a digital micro-minor device (DMD) for providing pixilated light, color mixing, and intensity control; and/or (7) an optic having quantum dots (QDs), wherein the light output of the DMD activates for the QDs.

BRIEF DESCRIPTION OF THE FIGURES

The accompanying drawings, which are incorporated herein, form part of the specification. Together with this written description, the drawings further serve to explain the principles of, and to enable a person skilled in the relevant art(s), to make and use an LED lighting system in accordance with the present invention. In the drawings, like reference numbers indicate identical or functionally similar elements.

DETAILED DESCRIPTION OF THE FIGURES

The following detailed description of the figures refers to the accompanying drawings that illustrate one or more exemplary embodiments of an LED lighting system. Other embodiments are possible. Modifications may be made to the embodiment described herein without departing from the spirit and scope of the present invention. Therefore, the following detailed description is not meant to be limiting.

Before describing one or more embodiments in detail, it is useful to provide definitions for key terms and concepts used herein. The term "monochromatic light" is intended to mean "a light having a half-peak spectral bandwidth of less than about 25 nm." The term "polychromatic light" is intended to mean "a light having a half-peak spectral bandwidth of more than about 25 nm, or a light with two or more spectral peaks."

Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges is also encompassed within the disclosure, subject to any specifically excluded limit in the stated range. Where the stated range includes one or both of the limits, ranges excluding either or both of those included limits are also included in the disclosure.

Figure 1:
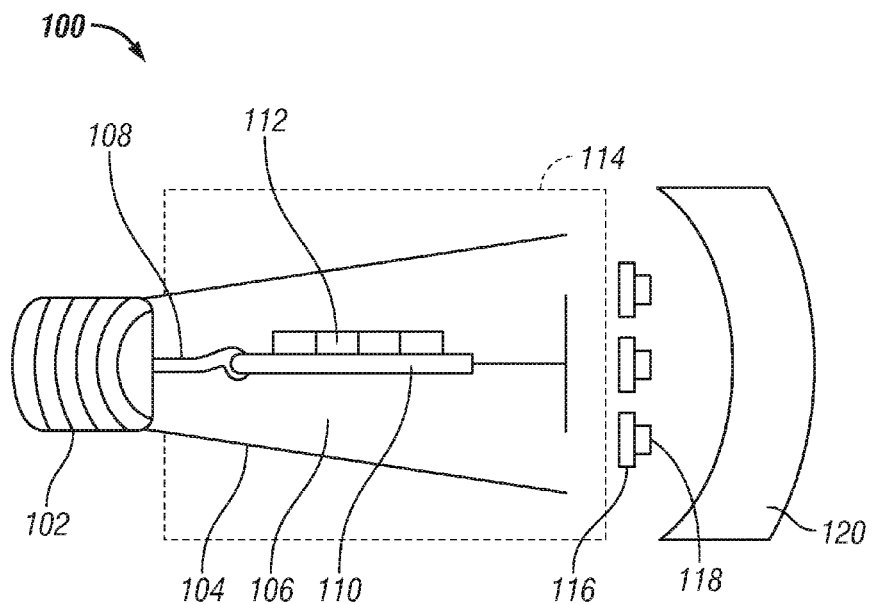
FIG. 1 is a schematic diagram of an LED lighting system.

As described above, FIG. 1 illustrates a schematic diagram of an LED lighting system, such as an LED light bulb 100. Additional LED lighting systems are described in U.S. Pat. Nos. 7,319,293; 7,521,875; 7,619,372; 7,633,779; 7,708,452; and 7,824,065; and U.S. Patent Application Publication No. 2010/0118510; all of which are incorporated by reference herein in their entirety.

Figure 2:
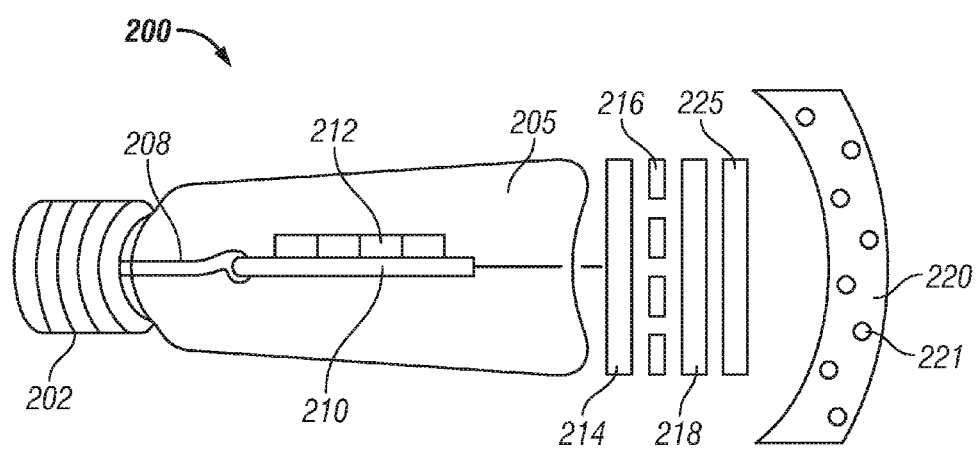
FIG. 2 is a schematic diagram of an LED lighting system, in accordance with one embodiment presented herein.

FIG. 2 is a schematic diagram of an LED lighting system, in accordance with one embodiment presented herein. As shown in FIG. 2, light bulb 200 includes a base 202, such as an Edison-type screw-in base. Light bulb 200 further includes a substrate, such as PCB 210, having electrical components 212 mounted thereon. Electrical leads 208 deliver current from base 202 to PCB 210. Light bulb 200, however, differs from light bulb 100 (described above) in that light bulb 200 lacks a housing 104 and associated cavity 106. Instead, PCB 210 of light bulb 200 is set within an over-mold 205, which removes the need for a potting procedure. In one embodiment, over-mold 205 is substantially free of silicon-emitting materials. The term "substantially free" should be interpreted to mean that either no silicon is emitted, or trace amounts of silicon are emitted, but such trace amounts have no effect on the function of proximate system components throughout the useful life of the system. For example, in one embodiment, over-mold 205 is formed of a combination of isocyanates and polyols. In one embodiment, over-mold 205 further includes one or more additives to improve the thermal properties of the over-mold. For example, over-mold 205 may include silicon carbide embedded beads with a particle size between about 60-80 microns; silicon carbide coated on a plastic/metal mesh; boron nitride; silicon nitride; aluminum oxide; low grade industrial diamonds; long carbon fibers; or any combination thereof. In one embodiment, over-mold 205 includes a conformal coating to isolate the over-mold from the active heat sink (described below). In one embodiment, over-mold 205 is set within a separate housing and/or coupled to a passive heat sink. The over-molding procedure is described in more detail below.

Light bulb 200 also differs from light bulb 100 in that light bulb 200 includes a solid state active heat sink component 214, which is used to cool one or more LED chips 216. Use of active heat sink component 214 provides more efficient and effective heat displacement. In operation, active heat sink 214 is powered by a power supply line extending from PCB 210. The powering of active heat sink 214 is described in more detail below. Active heat sink 214 may be a solid state cooling device or heat exchanger; a piezoelectric heat exchanger, such as a diffused-surface piezoelectric cooler; a plasma cooling system; micro-channel or micro-fluidics heat exchanger; or other active heat sink. In one embodiment, active heat sink 214 includes a filter component. In one embodiment, active heat sink 214 includes a charged filter, or an electrically aligned filter, to repel dust particles. As such, the filter serves as a self-cleaning means for the active heat sink 214. Examples of active heat sinks are provided in U.S. Pat. Nos. 7,661,468; and 7,802,970; and U.S. Patent Application Publication Nos. 2006/0011325; 2008/0175720; and 2010/0177519; all of which are herein incorporated by reference in their entirety.

In one embodiment, light bulb 200 includes phosphor coatings applied to LED chips 216, as described above, for photo down-conversion. Alternatively, light bulb 200 may include an active photo down-conversion mechanism 218. Photo down-conversion mechanism 218 may include one or more programmable/adjustable prisms to convert the light emitted from one or more LED chips 216 into a desired monochromatic or polychromatic light. The drive and/or control circuitry for photo down-conversion mechanism 218 may be provided on PCB 210. In another embodiment, light bulb 200 does not include a photo down-conversion mechanism 218, and color control/mixing is provided by use of the digital micro-minor device and/or quantum dot embodiments discussed below.

In one embodiment, for example, light bulb 200 further includes an optical semiconductor device, such as a digital micro-minor device (DMD) 225. DMD 225 may include a digital switching device for pixilated delivery of light. DMD 225 may be programmed or controlled, in real-time, to deliver a pixilated light output based on a light input from LED chips 216. DMD 225 may be used to control the direction, intensity, and color of the light output. In one embodiment, DMD 225 is integrated with a sensor to detect light-demand. Such sensor may provide a feedback loop indicating light-demand for a particular application. Such sensor may also include a motion detector, an image recognition engine, a positional detector, and/or a program/decision logic that identifies a target to be illuminated. DMD 225 may also be integrated with a dynamic light source, which redirects light to part of the DMD, or a static light source, which directs light onto the entire DMD. Further, DMD 225 includes a controller to control the direction and alignment of the minors in the DMD. In one embodiment, DMD 225 may be integrated with a telemetry system to receive remote commands from an external control source.

DMD technology is used in digital light processing (DLP) projection televisions. However, DMD technology used in televisions is directed to projecting an image onto a fixed geometry (i.e., fixed frame). In contrast, DMD 225 in light bulb 200 may be used to reshape a lighting frame (i.e., provide a variable lighting frame) so as to illuminate objects within the frame; follow a moving object within the frame; manage shadows within the frame; project images within the frame; manage intensity of pixels within the frame; and/or manage color of pixels within the frame. In one application, DMD 225 may be used to adjust the beam pattern emitted by light bulb 200. In another application, DMD 225 may be used to control/change colors projected on a wall/object, or may be used for general color mixing. In still another application, DMD 225 may be used in a retail setting to direct light to a particular object; highlight a particular object or display by controlling the light intensity on the object or display; or other customized lighting application.

In one embodiment, the light input to DMD 225 is provided directly from LED chips 216. In another embodiment, the light input to DMD 225 is provided by photo down-conversion mechanism 218. For example, one or more prisms in photo down-conversion mechanism 218 may be used to direct monochromatic light to one or more minors in DMD 225. As such, the combination of photo down-conversion mechanism 218 and DMD 225 may serve as a mechanism for color mixing. In another embodiment, the monochromatic light provided by photo down-conversion mechanism 218 is directed to a quantum dot array (as discussed below) via DMD 225.

For example, in one embodiment, light bulb 200 further includes an optic 220 having a plurality of quantum dots (QDs) 221 to convert monochromatic light into a desired polychromatic light. Differing QD layers may be provided, and DMD 225 may be programmed to provide activation to the one or more of such differing QD layers. As such, variable lighting may be provided by controlling the color or intensity of the light that is directed to QDs 221. Examples of QD technology used in LED lighting are provided in, for example, U.S. Pat. No. 7,692,373, which is herein incorporated by reference in its entirety.

Figure 3:
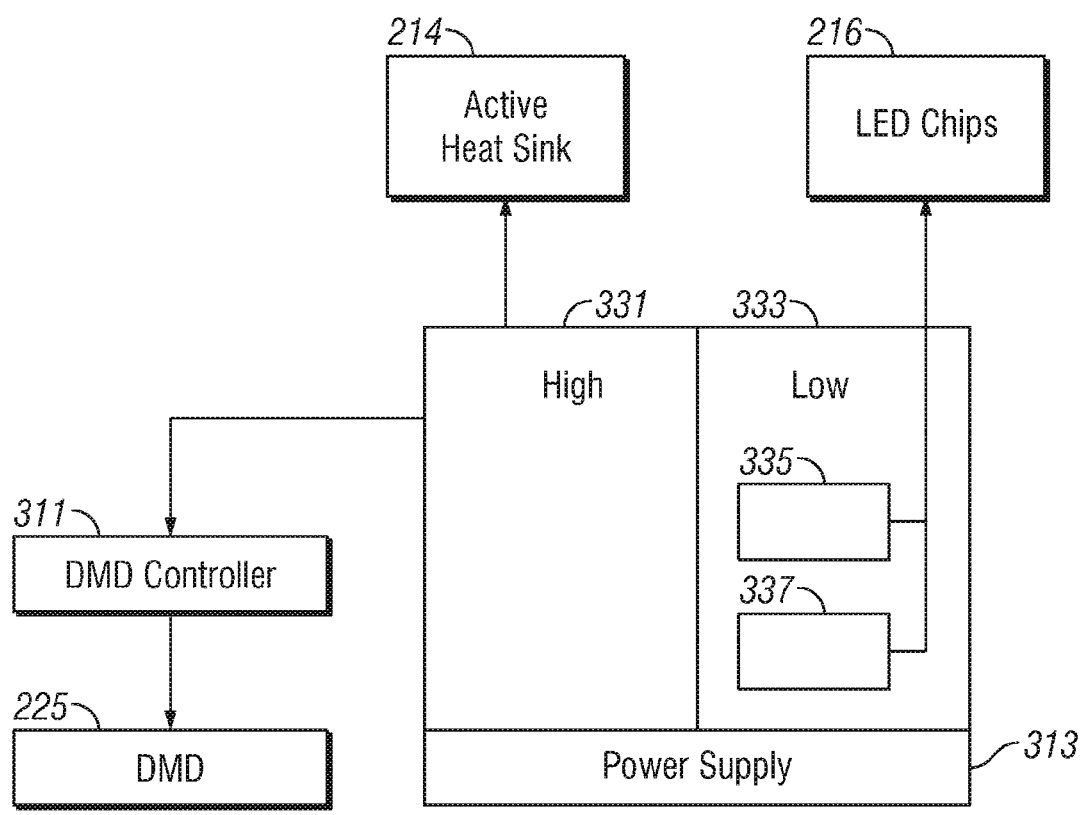
FIG. 3 is a block diagram of a power supply configuration, in accordance with one embodiment presented herein.

FIG. 3 is a block diagram of a front-end power supply configuration, in accordance with one embodiment presented herein. Power supply 313 is configured to provide a high voltage output 331 to high-demand components, such as DMD controller 311, DMD 225, and/or active heat sink 214. Power supply 313 is also configured to provide a low voltage output 333 to LED chips 216. In one embodiment, power supply 313 is configured to provide two or more output channels. In one embodiment, power supply 313 is configured to provide a high voltage output 331 of about 4 kV-25 kV. In one embodiment, power supply 313 is configured to provide a high voltage output 331 that is at least 2 kV higher than low voltage output 333. In one embodiment, power supply 313 includes a piezoelectric transformer. In another embodiment, power supply 313 is replaced with two or more distinct power supplies.

Additionally, in one embodiment, power supply 313 is configured to have a switching circuit, such that the number of LEDs being driven will have a drive voltage similar to that of the rectified AC during any given phase in the AC cycle. The switching circuit does not require any electrolytic capacitors.

Figure 4:
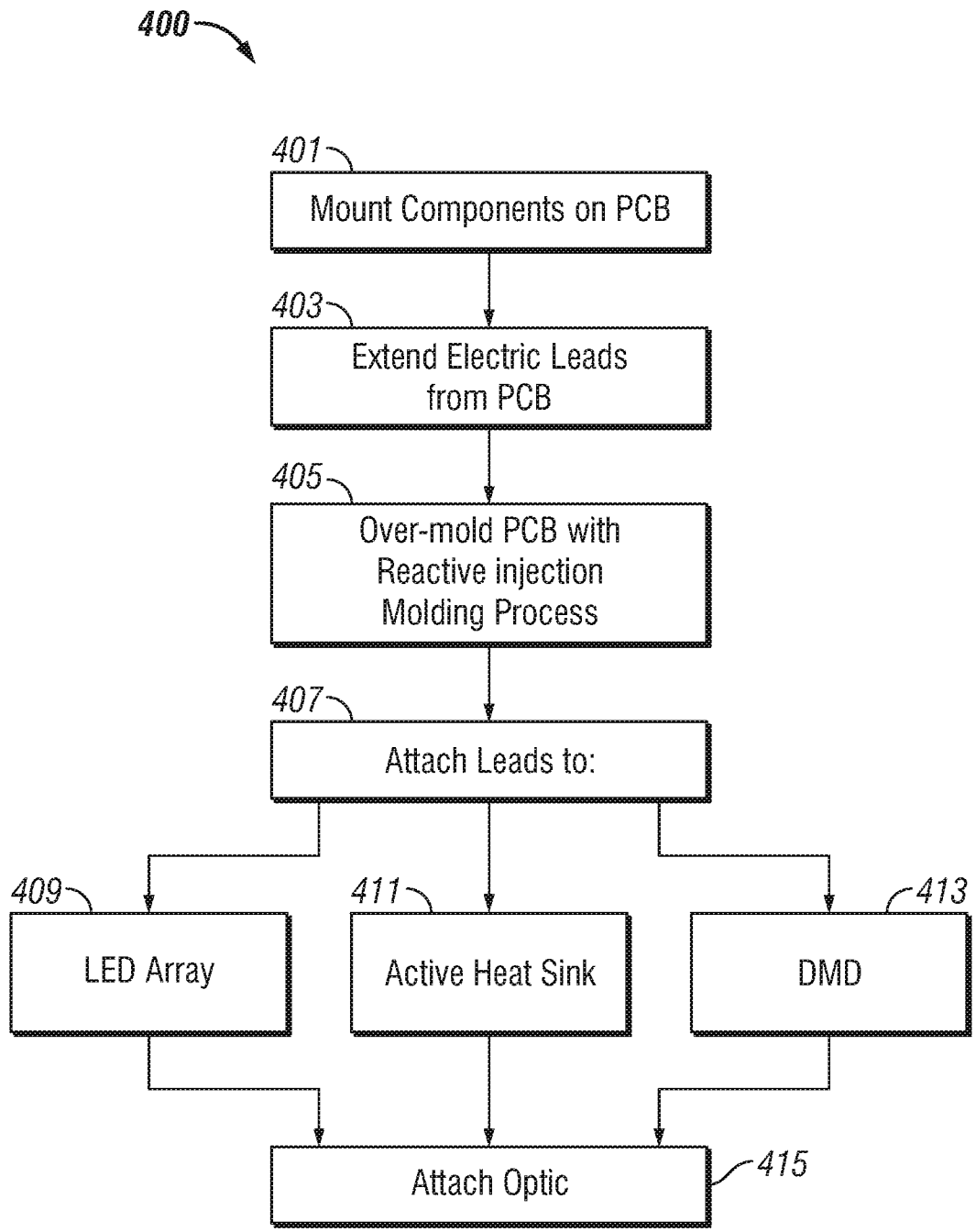
FIG. 4 is a flowchart illustrating a method of manufacture, in accordance with one embodiment presented herein.

FIG. 4 is a flowchart illustrating a method of manufacturing an LED lighting system, in accordance with one embodiment presented herein. In step 401, electrical components are mounted onto a PCB. Such electrical components include power supply circuitry, drive circuitry, and any necessary controllers or processors for the LED lighting system. For example, in the embodiment wherein a DMD is employed, a DMD controller may be mounted onto a PCB in step 401. In step 403, electrical leads or contacts are extended from the PCB in order to provide electrical connectivity with an LED array, an active heat sink, and/or a DMD. Input leads are also extended from the PCB in order to connect with the screw-in base. In step 405, the PCB is over-molded with a reactive injection molding (RIM) process. The relatively low temperature and low process pressure of the RIM process encapsulates the PCB (and mounted components), while protecting sensitive circuit components. RIM encapsulation techniques are known in the art, and are described in, for example, U.S. Pat. Nos. 6,143,214; and 7,352,070; both of which are incorporated herein by reference in their entirety. RIM encapsulation may also be automated to remove some of the manual steps generally involved in the production of LED lighting systems. In one embodiment, a screw-in base shell is set within the RIM mold tool such that the over-mold is presented and coupled to the screw-in base during the RIM procedure. A pinch/key feature may be added in order to permanently couple the screw-in base to the over-mold.

The RIM encapsulation of step 405 results in an over-mold, such as over-mold 205 of light bulb 200. Such over-mold removes the need for a potting procedure and/or housing. In one embodiment, the over-mold is inserted into a separate housing and/or passive heat sink. In one embodiment, the over-mold is substantially free of silicon-emitting materials. For example, in one embodiment, the over-mold is formed of a combination of isocyanates and polyols. In one embodiment, the over-mold further includes one or more additives to improve the thermal properties of the over-mold. For example, the over-mold may include silicon carbide embedded beads with a particle size between about 60-80 microns; silicon carbide coated on a plastic/metal mesh; boron nitride; silicon nitride; aluminum oxide; low grade industrial diamonds; long carbon fibers; or any combination thereof. In one embodiment, the over-mold includes a conformal coating to isolate the over-mold from the active heat sink.

In step 407, the extended electrical leads are attached to an LED chip array (step 406), an active heat sink component (step 411), and/or a DMD (step 413). Each component is then coupled to the over-mold. In step 415, an optic is attached to the system. The optic may include QDs 221 as described above.

Conclusion

The foregoing description of the invention has been presented for purposes of illustration and description. It is not intended to be exhaustive or to limit the invention to the precise form disclosed. Other modifications and variations may be possible in light of the above teachings. The embodiments were chosen and described in order to best explain the principles of the invention and its practical application, and to thereby enable others skilled in the art to best utilize the invention in various embodiments and various modifications as are suited to the particular use contemplated. It is intended that the appended claims be construed to include other alternative embodiments of the invention; including equivalent structures, components, methods, and means.

It is to be appreciated that the Detailed Description section, and not the Brief Summary and Abstract sections, is intended to be used to interpret the claims. The Summary and Abstract sections may set forth one or more, but not all exemplary embodiments of the present invention as contemplated by the inventor(s), and thus, are not intended to limit the present invention and the appended claims in any way.

What is claimed is:

1. A method of manufacturing an LED lighting system, comprising:
   mounting a front end power supply on a substrate;
   extending electrical leads from the power supply;
   over-molding the front end power supply with a reactive injection molding process; and
   electrically coupling an extended electrical lead to one or more light-emitting diodes and to a solid state active heat sink, and further comprising: mounting a digital micro-mirror device controller to the substrate; extending a controller lead from the substrate; and after the over-molding step, electrically coupling the controller lead to a digital micro-mirror device.

2. The method of claim 1, further comprising:
   electrically coupling an extended electrical lead to a solid state active heat sink,
   and wherein the over-molding material is substantially free of silicon-emitting particles.

3. The method of claim 2, further comprising:
   configuring the power supply to deliver at least two outputs.

4. The method of claim 1, further comprising:
   configuring the power supply to deliver a high voltage power to the active heat sink.

5. The method of claim 1, further comprising:
   configuring the power supply to deliver a low voltage power to the light-emitting diodes.

6. The method of claim 1, further comprising:
   configuring the power supply to provide a high voltage power and a low voltage power, wherein the high voltage power is 2 kV or more higher than the low voltage power.

7. The method of claim 1, further comprising:
   mounting an optic over the digital micro-mirror device.

8. The method of claim 7, wherein the optic includes a plurality of quantum dots for producing polychromatic light.

9. The method of claim 1, further comprising:
adding one or more additives to the over-molding process, wherein the additives are selected from the group consisting of: silicon carbide embedded beads, silicon carbide coated on a plastic/metal mesh, boron nitride, silicon nitride, aluminum oxide, low grade industrial diamonds, long carbon fibers, and any combination thereof.

10. The method of claim 9, wherein the silicon carbide embedded beads have a particle size between about 60-80 microns.

11. The method of claim 1, further comprising:
providing a coating on the over-mold to isolate the over-mold from the active heat sink.

* * * * *